(12) United States Patent
Tanzawa

(10) Patent No.: US 10,956,642 B2
(45) Date of Patent: Mar. 23, 2021

(54) APPARATUSES AND METHODS FOR MEASURING AN ELECTRICAL CHARACTERISTIC OF A MODEL SIGNAL LINE AND PROVIDING MEASUREMENT INFORMATION

(71) Applicant: Micron Technology, Inc., Boise, ID (US)

(72) Inventor: Toru Tanzawa, Adachi (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/432,632

(22) Filed: Jun. 5, 2019

(65) Prior Publication Data

US 2019/0286777 A1 Sep. 19, 2019

Related U.S. Application Data

(60) Continuation of application No. 16/105,571, filed on Aug. 20, 2018, now Pat. No. 10,354,030, which is a division of application No. 15/061,559, filed on Mar. 4, 2016, now Pat. No. 10,083,265, which is a division of application No. 13/946,841, filed on Jul. 19, 2013, now Pat. No. 9,318,173.

(51) Int. Cl.
*G06F 30/367* (2020.01)
*G11C 7/22* (2006.01)
*G11C 7/10* (2006.01)
*G11C 13/00* (2006.01)
*G11C 29/02* (2006.01)

(52) U.S. Cl.
CPC .......... *G06F 30/367* (2020.01); *G11C 7/1066* (2013.01); *G11C 7/227* (2013.01); *G11C 13/0021* (2013.01); *G11C 29/025* (2013.01)

(58) Field of Classification Search
CPC ............... G06F 30/367; G11C 29/025; G11C 13/0021; G11C 7/1066; G11C 7/227
See application file for complete search history.

(56) References Cited

U.S. PATENT DOCUMENTS

| 5,272,390 | A | 12/1993 | Watson, Jr. et al. |
| 8,803,545 | B2 | 8/2014 | Yoko et al. |

(Continued)

OTHER PUBLICATIONS

U.S. Appl. No. 16/105,571 titled "Apparatuses and Methods for Measuring an Electrical Characteristic of a Model Signal Line and Providing Measurement Information" filed Aug. 20, 2018; pp. all.

(Continued)

*Primary Examiner* — Jerome Leboeuf
(74) *Attorney, Agent, or Firm* — Dorsey & Whitney LLP

(57) ABSTRACT

Apparatuses and methods for measuring an electrical characteristic of a model signal line and providing measurement information based at least in part on the measurement of the electrical characteristic. An example apparatus includes a signal line model including a model signal line configured to model electrical characteristics of a signal line. The apparatus further includes a measurement circuit coupled to the signal line model and configured to measure the electrical characteristic of the model signal line responsive to an input signal provided to the model signal line. The measurement circuit is further configured to provide measurement information based at least in part on the measurement to set a signal applied to the signal line.

16 Claims, 10 Drawing Sheets

(56) References Cited

U.S. PATENT DOCUMENTS

| | | |
|---|---|---|
| 9,318,173 B2 | 4/2016 | Tanzawa |
| 10,083,265 B2 | 9/2018 | Tanzawa |
| 2002/0147575 A1 | 10/2002 | Bois et al. |
| 2008/0189568 A1 | 8/2008 | Kwak |
| 2009/0109772 A1 | 4/2009 | Terzioglu et al. |
| 2009/0153176 A1 | 6/2009 | Inaba |
| 2010/0310030 A1 | 12/2010 | Bhagavatheeswaran et al. |
| 2011/0032746 A1 | 2/2011 | Maejima et al. |
| 2011/0175639 A1 | 7/2011 | Yoko et al. |
| 2012/0114086 A1 | 5/2012 | Hayashi |
| 2013/0094272 A1 | 4/2013 | Riho |
| 2013/0155770 A1 | 6/2013 | Hirano |
| 2014/0226402 A1 | 8/2014 | Duzly et al. |
| 2014/0241049 A1 | 8/2014 | Vimercati et al. |
| 2015/0003161 A1 | 1/2015 | Avila et al. |
| 2015/0023104 A1 | 1/2015 | Tanzawa |
| 2016/0188775 A1 | 6/2016 | Tanzawa |
| 2018/0357349 A1 | 12/2018 | Tanzawa |

OTHER PUBLICATIONS

Jang, et al. "Vertical Cell Array using TCAT (Terabit Cell Array Transistor) Technology for Ultra High Density NAND Flash Memory", 2009 Symposium on VLSI Technology Digest of Technical Papers, Jun. 2009, pp. 192-193.

Katsumata, et al. "Pipe-shaped BiCS Flash Memory with 16 Stacked Layers and Multi-Level-Cell Operation", 2009 Symposium on VLSI Technology Digest of Technical Papers, Center for Semiconductor R&D, Jun. 2009, pp. 136-137.

Kim, et al. "Multi-Layered Vertical Gate NAND Flash Overcoming Stacking Limit for Terabit Density Storage", 2009 Symposium on VLSI Technology Digest of Technical Papers, Device Architecture Laboratory, Semiconductor R&D Center, Jun. 2009, pp. 188-189.

Kim, et al. "Novel Vertical-Stacked-Array-Transistor (VSAT) for ultra-high-density and cost-effective NAND Flash memory devices and SSD (Solid State Drive)", 2009 Symposium on VLSI Technology Digest of Technical Papers, Department of Materials Science and Engineering, UCLA, Process Development Team, Jun. 2009, pp. 186-187.

APPARATUSES AND METHODS FOR MEASURING AN ELECTRICAL CHARACTERISTIC OF A MODEL SIGNAL LINE AND PROVIDING MEASUREMENT INFORMATION

CROSS REFERENCE TO RELATED APPLICATION

This application is a continuation of U.S. application Ser. No. 16/105,571 filed Aug. 20, 2018, and issued as U.S. Pat. No. 10,354,030 on Jul. 16, 2019, which is a divisional of U.S. application Ser. No. 15/061,559 filed Mar. 4, 2016, and issued as U.S. Pat. No. 10,083,265 on Sep. 25, 2018, which is a divisional of U.S. application Ser. No. 13/946,841 filed Jul. 19, 2013, and issued as U.S. Pat. No. 9,318,173 on Apr. 19, 2016. The afore-mentioned applications and issued patents are incorporated herein by reference, in their entirety, and for any purposes.

BACKGROUND

Signal lines are used in integrated circuits to conduct and provide electrical signals that are applied to the signal lines. The signal lines have electrical characteristics (e.g., resistance, capacitance, impedance, propagation delay, etc.), which may need to be taken into account when the electrical signals are applied to the signal lines. For example, a voltage signal applied to a signal line having greater impedance will generally take longer to reach a maximum voltage than for a signal line having lower impedance. Likewise, a signal line having greater impedance will generally have greater inherent propagation delay than a signal line having lower impedance, thus, the electrical signal may take greater time to propagate from one end of the signal to the other end.

The electrical characteristics of a signal line may be affected by a variety of factors. For example, the electrical characteristics of a signal line may be affected by the conductive material used for the signal line, the physical dimensions and geometry of the signal line, variations in the fabrication process of the signal line, and more.

Within a semiconductor structure including signal lines intended to have common electrical signals applied, it may be necessary to operate according to the signal line having the poorest performance. For example, where the semiconductor structure includes several signal lines that serve a similar function (e.g., word lines, digit lines, input/output lines, etc.), an electrical signal may be applied to all of the signal lines in a manner (e.g., voltage level, duration, etc.) that provides sufficient performance based on the signal line having, for example, the greatest impedance. Although the electrical signal could be better tailored for application to other ones of the signal lines of the structure, which may result in greater overall performance of the integrated circuit, such operation would require understanding the electrical characteristics of the particular signal lines so that the electrical signal will be applied to a particular signal line in a manner to provide sufficient performance.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
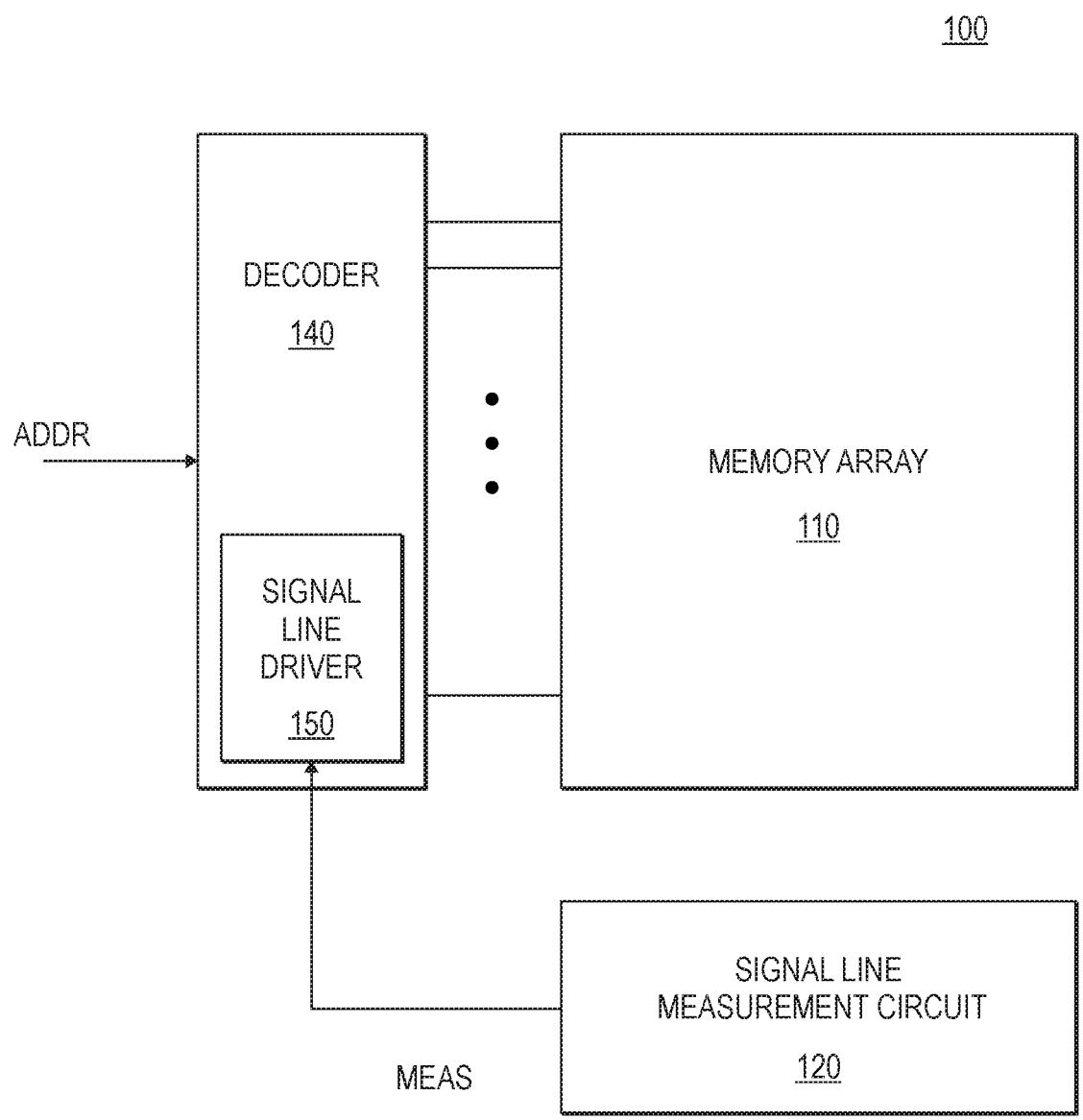
FIG. 1 is a block diagram of an apparatus that includes a signal line measurement circuit according to an embodiment of the invention.

FIG. 1 illustrates an apparatus that includes a memory array 110 including memory cells configured to be accessed to store and retrieve information, and a decoder 140 configured to decode a memory address ADDR to access memory cells associated with the memory address. The decoder 140 includes a signal line driver 150 configured to provide a signal to a signal line of the memory array 110 when accessing the memory cells. For example, the signal line driver 150 may be configured to provide a signal to word lines of the memory array 110 when accessing the memory cells, such as a program pulse for storing (e.g., programming) information in the memory cells. The signal line driver 150 may be configured to provide a read signal to the word lines as well when reading information from the memory cells. In some embodiments, the signal line driver 150 may be configured to provide a signal to signal lines of the memory array 110 other than to the word lines. In an example, the signal line driver may be configured to provide a signal to digit lines of the memory array when accessing memory cells.

The apparatus further includes a signal line model measurement circuit 120 according to an embodiment of the invention. The signal line model measurement circuit 120 may be configured to measure an electrical characteristic of model signal lines, and provide measurement information MEAS to the signal line driver 150. As will be described in more detail below, the signal line mode measurement circuit 120 may include a signal line model that includes model signal lines. Electrical characteristics of the model signal lines may be measured by a measurement circuit included in the signal line model measurement circuit 120, which provides the MEAS information based at least in part on the measurement. The model signal lines may be used to model the signal lines of other circuits, for example, signal lines of the memory array. The MEAS information may be based at least in part on the measured electrical characteristic. The signal line driver 150 may provide a signal for a signal line of the memory array 110 based at least in part on the MEAS information from the signal line model measurement circuit 120. For example, a characteristic of the signal may be based at least in part on the MEAS information. In some embodiments, the characteristic of the signal may be adjusted based at least in part on the MEAS information. Examples of characteristics of the signal include a voltage level of the signal, a pulse height or width, as well as other characteristics.

Figure 2:
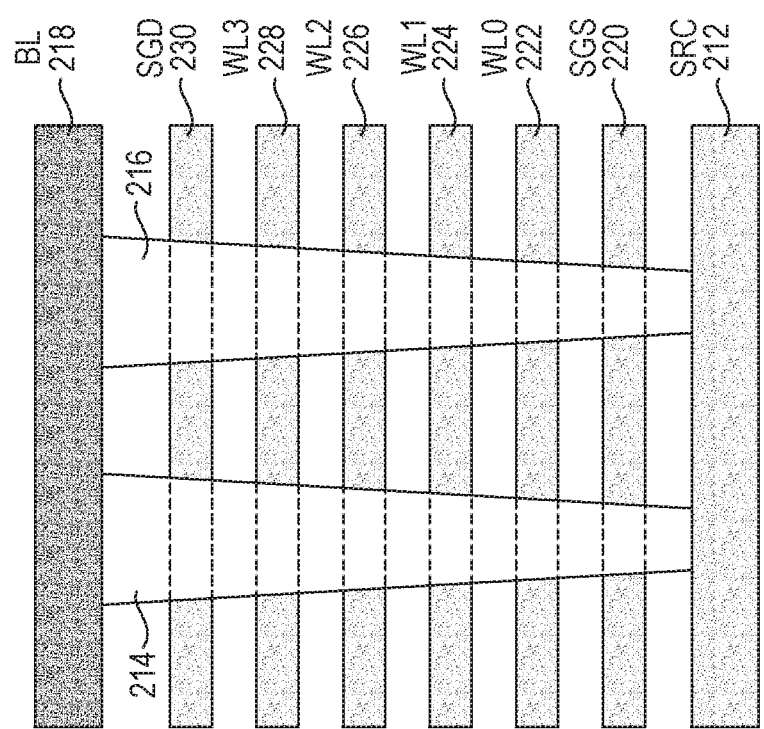
FIG. 2 is a cross-sectional diagram of a portion of semiconductor structure including a three-dimensional (3D) NAND memory array.

FIG. 2 illustrates a cross-section of a portion of semiconductor structure 200 that may be included in a memory array (e.g., the memory array 110 of FIG. 1). The structure 200 includes a bit line BL 218, source SRC 212, and bodies of vertical NAND string 214 and 216. Disposed between the bit line 218 and the source 212 are signal lines: select-gate source line SGS 220, word lines WL0-WL3 222-228, and select-gate drain line SGD 230. The structure 200 may be included in a three-dimensional (3D) NAND memory array including a select-gate drain line, a select-gate source line, and word lines. As illustrated in FIG. 2, in a direction from the source SRC 212 to the bit line BL 218, the word lines WL0-WL3 222-228 have smaller dimensions due to the increasing dimension of the bodies 214 and 216. Electrical characteristics (e.g., resistance, capacitance, impedance, propagation delay, etc.) of a signal line may be based at least in part on its physical dimensions. As a result, the resistance-capacitance of the word lines WL0-WL3 222-228 may be different from one word line to another. For example, the word line WL0 222 may have different resistance-capacitance than the word line WL3 228 due to the smaller dimensions of WL3 228 relative to the word line WL0 222. As also known, the electrical characteristics may also be affected by other factors, for example, process and operating conditions, such as temperature and voltage. The different electrical characteristics of the signal lines may require operating conditions that are acceptable for operating over the range of different electrical characteristics, but could be nonetheless be more tailored to the different electrical characteristics of the particular signal lines and improve performance.

For example, with respect to the word lines, a duration of a programming pulse that may be acceptable for programming information through word line WL3 228 may be longer than necessary for programming information through word line WL0 220. However, in order to ensure that information is correctly programmed for all of the word lines WL0-WL3 220-228, a longer duration programming pulse is applied for all of the word lines WL0-WL3 220-228 although accurate programming could be achieved through the word line WL0 220 with a shorter duration programming pulse.

Figure 3:
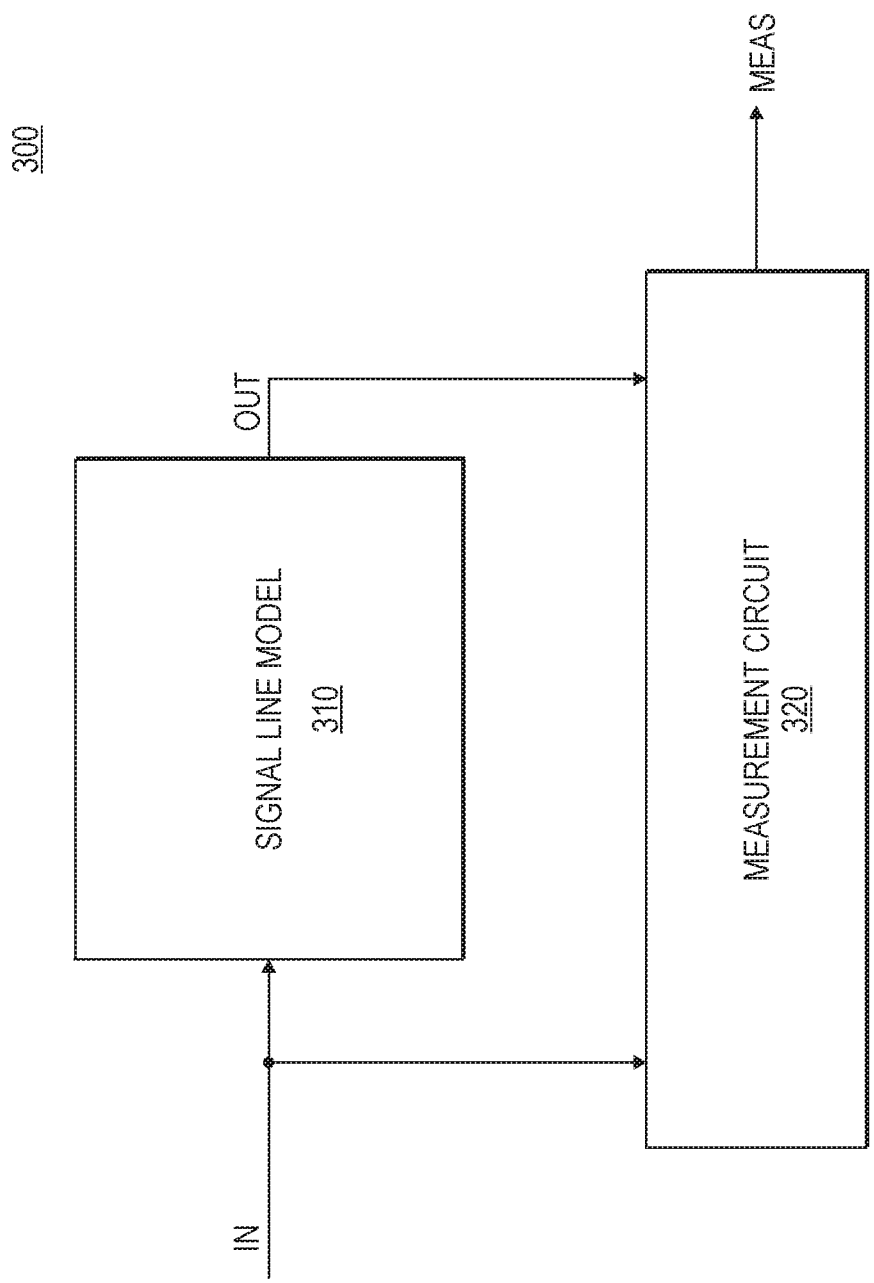
FIG. 3 is a signal line model measurement circuit according to an embodiment of the invention.

FIG. 3 illustrates a signal line model measurement circuit 300 according to an embodiment of the invention. The signal line model measurement circuit 300 may be used as the signal line model measurement circuit 120 of FIG. 1. The signal line model measurement circuit 300 includes a signal line model 310 and a measurement circuit 320. The signal line model 310 may include model signal lines (not shown in FIG. 3) that may be configured to model electrical characteristics of a signal line or signal lines. The signal line or lines being modeled may be included in another circuit of an apparatus also including the signal line model measurement circuit 300, for example, a signal line included in a memory array of a memory. The measurement circuit 320 may be configured to measure an electrical characteristic of the model signal lines of the signal line model 310. For example, in some embodiments of the invention, the measurement circuit 320 is configured to measure a propagation delay of a model signal line. As known, the propagation delay of a signal line (or model signal line) may be related to the resistance-capacitance (RC) of the signal line. Based on the measurement, the measurement circuit 320 provides a measurement information MEAS that based on the measurement of the measured electrical characteristic.

In operation, an input signal IN is provided to a model signal line of the signal line model 310. Responsive to the IN signal, an output signal OUT is provided by the model signal line. An example of an IN signal is a signal that includes a signal transition from one logic level to the other logic level (e.g., from a low logic level to a high logic level). The resulting OUT signal for this example is the IN signal after propagating through the model signal line. The measurement circuit 320 receives both the IN signal and OUT signal to measure the electrical characteristic of the model signal line, for example, in some embodiments, a propagation delay of the model signal line. Based on the measurement, the measurement circuit 320 provides MEAS information that represents the measurement of the measured electrical characteristic. In an embodiment that measures the propagation delay of the model signal line, the MEAS information may include a pulse having a pulse width that represents the propagation delay of the model signal line. The MEAS information provided by the measurement circuit 320 may be used to set (e.g., originally setting, adjusting, modulating, changing, varying, resetting, confirming, etc.), for example, operational conditions (e.g., voltage, current, impedance, and/or other operation condition) for operations involving the signal line that was modeled by the model signal line measured by the measurement circuit 320. In some embodiments, the MEAS information may be provided to a signal line driver that provides a signal (e.g., voltage signal, current signal, etc.) to a signal line being modeled by the measured signal line that is based on the MEAS information. A characteristic of the signal may be based at least in part on and/or adjusted based at least in part on the MEAS information, for example, a voltage level of the signal, a pulse duration, as well as other characteristics, may be based on the MEAS information. MEAS information including a pulse having a pulse width that represents the propagation delay of the model signal line may be used by the signal line driver to provide a signal having a pulse width based on the MEAS information. In this manner, the pulse width of the signal may be more tailored to a particular signal line.

Figure 4:
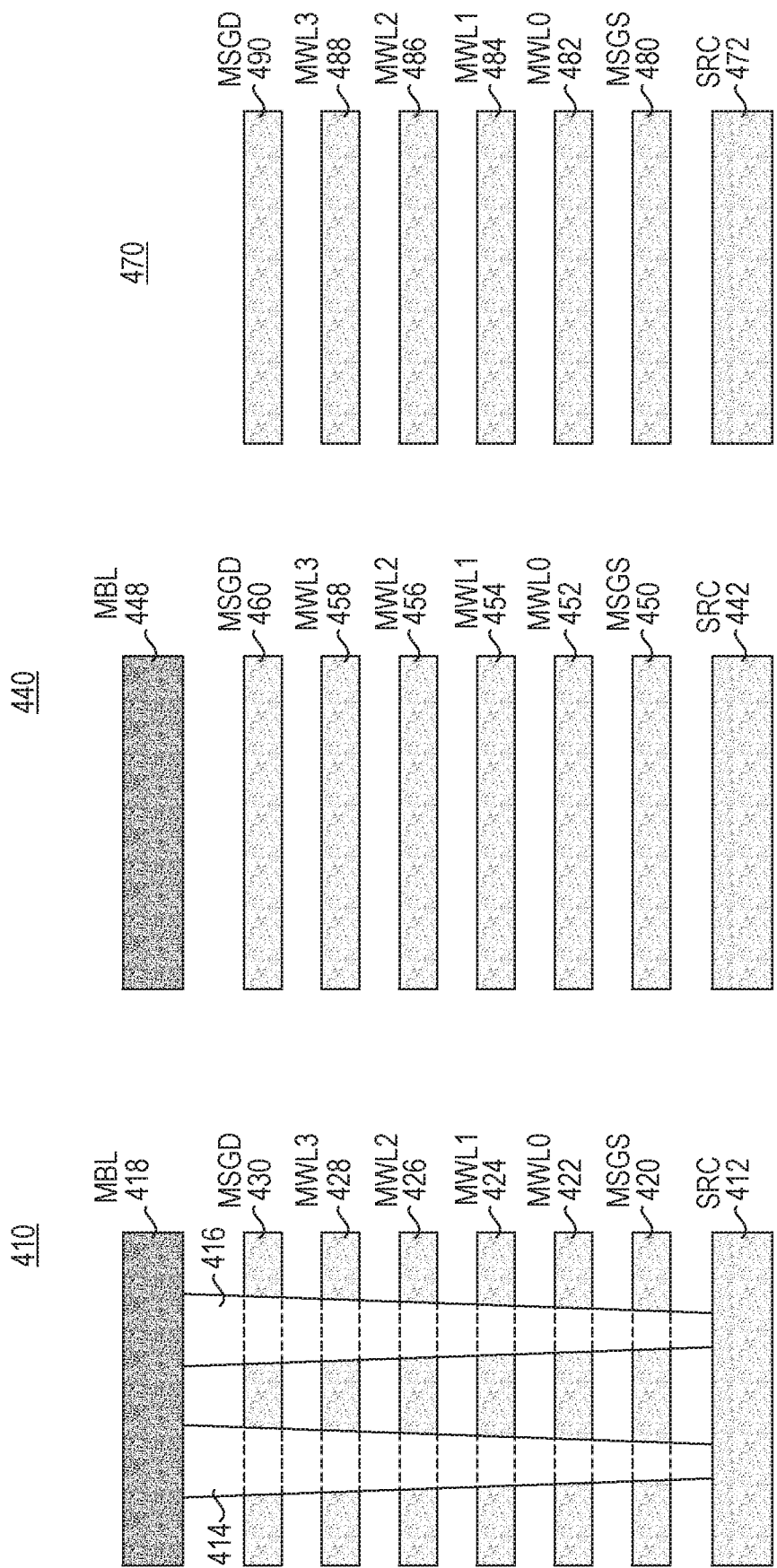
FIG. 4A is a cross-sectional diagram of signal line model according to an embodiment of the invention.
FIG. 4B is a cross-sectional diagram of signal line model according to an embodiment of the invention.
FIG. 4C is a cross-sectional diagram of signal line model according to an embodiment of the invention.

FIG. 4A illustrates a cross-sectional view of signal line model 410 according to an embodiment of the invention. The signal line model 410 may be included in the signal line model 310 of FIG. 3. The signal line model 410 may include a model bit line MBL 418, source SRC 412, and bodies of vertical NAND string 414 and 416. Disposed between the model bit line 418 and the source 412 are model signal lines: model select-gate source line MSGS 420, model word lines MWL0-MWL3 422-428, and model select-gate drain line MSGD 430. The signal line model 410 may be configured similarly to that of a structure including signal lines modeled by the model signal lines 420-430, for example, a portion of a three-dimensional (3D) NAND memory array including a select-gate drain line, a select-gate source line, and word lines. For example, with reference to a portion of semiconductor structure 200 of FIG. 2, the signal line model 410 includes the same general structure as the structure 200, such as having the same signal lines and bodies as the structure 200.

FIG. 4B illustrates a cross-sectional view of signal line model 440 according to an embodiment of the invention. The signal line model 440 may be included in the signal line model 310 of FIG. 3. The signal line model 440 may include a model bit line MBL 448 and source SRC 442. Disposed between the model bit line 448 and the source 442 are model signal lines: model select-gate source line MSGS 450, model word lines MWL0-MWL3 452-458, and model select-gate drain line MSGD 460. In contrast to the signal line model 410 of FIG. 4A, the signal line model 440 does not include bodies of vertical NAND strings. The signal line model 440 may be easier to fabricate in comparison to the signal line model 410. Although the signal line model 440 may be configured differently than a structure including signal lines modeled by the model signal lines 450-460, for example, a portion of a three-dimensional (3D) NAND memory array including a select-gate drain line, a select-gate source line, vertical NAND string bodies, and word lines, the signal line model 440 may nonetheless sufficiently model the signal lines. To improve model accuracy, differences in the electrical characteristics between the signal line model 440 and the structure being modeled may be taken into account when utilizing the MEAS information in determining operational conditions for the structure being modeled.

FIG. 4C illustrates a cross-sectional view of signal line model 470 according to an embodiment of the invention. The signal line model 470 may be included in the signal line model 310 of FIG. 3. The signal line model 470 may include a source SRC 472 and model signal lines: model select-gate source line MSGS 480, model word lines MWL0-MWL3 482-488, and model select-gate drain line MSGD 490. In contrast to the signal line model 440 of FIG. 4B, the signal line model 470 does not include a model bit line. The signal line model 470 may be easier to fabricate in comparison to the signal line model 440. Although the signal line model 470 may be configured differently than a structure including signal lines modeled by the model signal lines 480-490, for example, a portion of a three-dimensional (3D) NAND memory array including a select-gate drain line, a select-gate source line, and word lines, the signal line model 470 may nonetheless sufficiently model the signal lines. To improve model accuracy, differences in the electrical characteristics between the signal line model 470 and the structure being modeled may be taken into account when utilizing the MEAS information in determining operational conditions for the structure being modeled.

In some embodiments, a signal line model may include a fewer or greater number of model signal lines, and may include alternative model signal lines than that shown in the signal line models 410, 440, and 470. For example, in some embodiments, a signal line model may include greater or fewer model word lines than shown for signal line models 410, 440, and 470. Some signal line models may include a model source, or another model signal line not shown in FIGS. 4A-4C. A signal line model may include all, some, or none of the signal line structure of signal lines being modeled. Other circuitry may be included in the signal line model to model signal lines, such as resistances and capacitances. Electrical characteristics of such circuitry may be based on the physical structure of the respective signal lines being modeled by the model signal lines.

Figure 5:
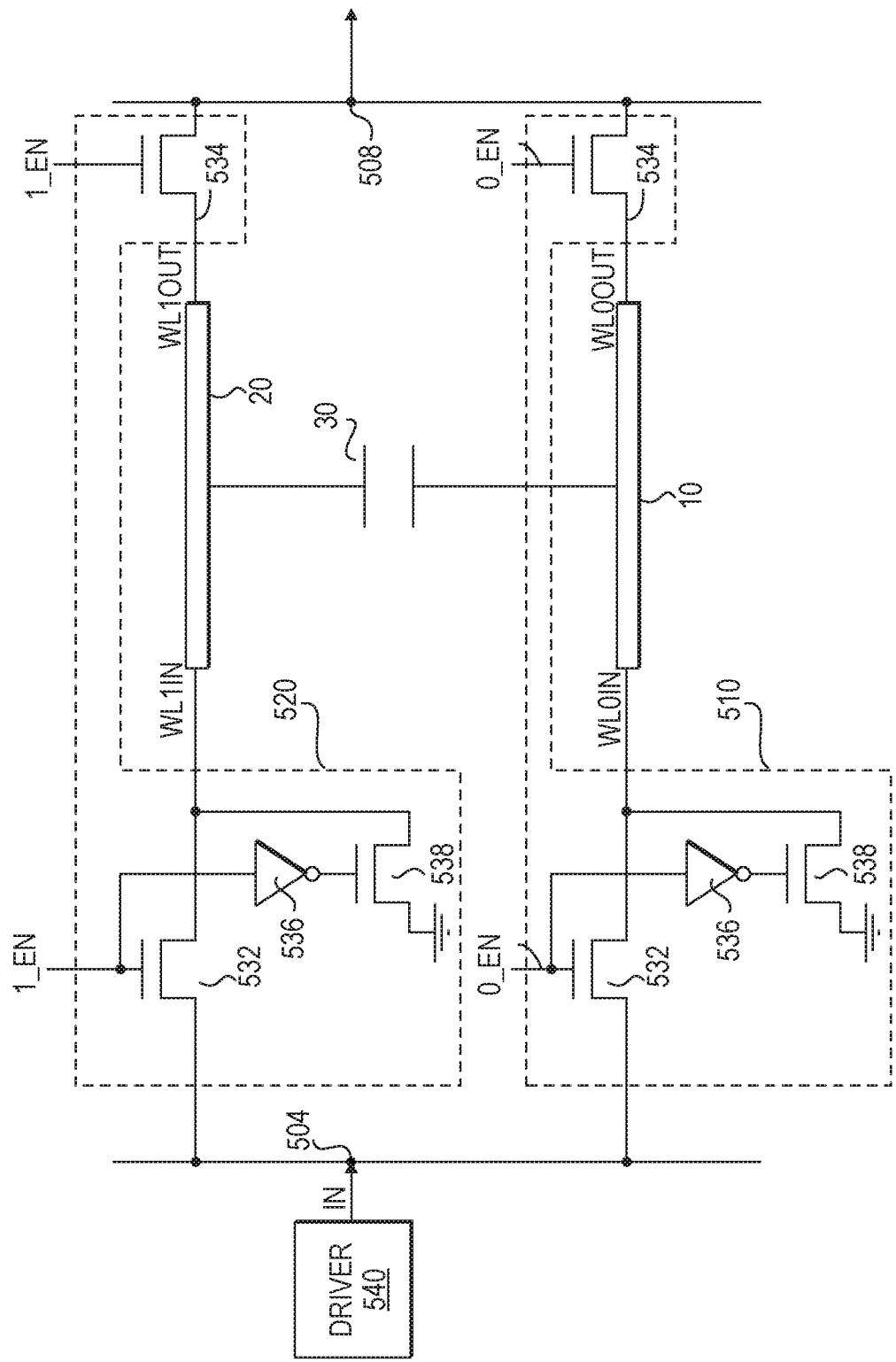
FIG. 5 is a schematic diagram of circuitry for selecting a model signal line of a signal line model according to an embodiment of the invention.

FIG. 5 illustrates circuits according to an embodiment of the invention for selecting a model signal line of a signal line model and providing an input signal IN for measurement, for example, by a measurement circuit. Model signal lines 10 and 20 are coupled to respective coupling circuits 510 and 520. The coupling circuit 510 and 520 are coupled to input node 504 and output node 508. The model signal lines 10 and 20 may be capacitively coupled, as represented in FIG. 5 by parasitic capacitance 30. A driver circuit 540 is coupled to the input node 504 and configured to provide the IN signal that is coupled to a model signal line through the respective coupling circuit. Other embodiments of the invention may include additional driver circuits, coupling circuits, and additional model signal lines.

The coupling circuits 510 and 520 are configured to couple a respective model signal line 10 and 20 to the input and output nodes 504 and 508 responsive to a respective enable signal 0_EN and 1_EN. The coupling circuits 510 and 520 include switch 532 to couple the respective model signal line to the input node 504 and further include switch 534 to couple the respective model signal line to the output node 508. The switches 532 and 534 are enabled by an active (e.g., high logic level) respective enable signal. A switch 538 coupled to an inverter 536 is configured to couple the respective model signal line to a reference voltage, for example, ground, responsive to a respective inactive (e.g., low logic level) enable signal.

In operation, an active 1_EN signal enables switches 532 and 534 of the coupling circuit 520 to couple the input node 504 and the output node 508 to the model signal line 20. The 0_EN signal is inactive when the 1_EN signal is active, which enables the switch 538 of the coupling circuit 510 to couple the model signal line 10 to ground. When the 1_En signal is active and the 0_EN signal is inactive, an input signal IN provided by the driver circuit 540 to the input node 504 is propagated through the model signal line 20 to the output node 508 to be provided as an output signal OUT. The capacitive coupling of model signal lines 10 and 20 may simulate the operating conditions of signal lines modeled by the model signal lines 10 and 20. Similar to the previous example, an active 0_EN signal and an inactive 1_EN signal couples the model signal line 10 to the input node 504 and the output node 508, and couples the model signal line 20 to ground. Thus, an IN signal provided to the input node 504 will propagate through the model signal line 10 to the output node 508, and be subject to the capacitive coupling with the model signal line 20. As previously discussed, the IN and OUT signals may be provided to a measurement circuit coupled to measure the propagation delay of the IN signal through the model signal line coupled to the input and output nodes 504, 508.

In some embodiments, the driver 540 providing the IN signal may be configured to have similar electrical characteristics as a driver driving a signal line being modeled. For example, the driver 540 may be configured to have an output impedance similar to a signal line driver providing a voltage to a signal line being modeled that is included in a memory array. Likewise, the switch 532 and/or switch 534 may be configured to have similar electrical characteristics as switches coupling a signal line being modeled. For example, the switch 532 and/or switch 534 may have an impedance similar to a switch coupling a signal line being modeled. Including circuitry having similar electrical characteristics as those coupled to a signal line being modeled may improve accuracy of the measurement and MEAS information provided. Including such circuitry, however, may be optional.

Figure 6:
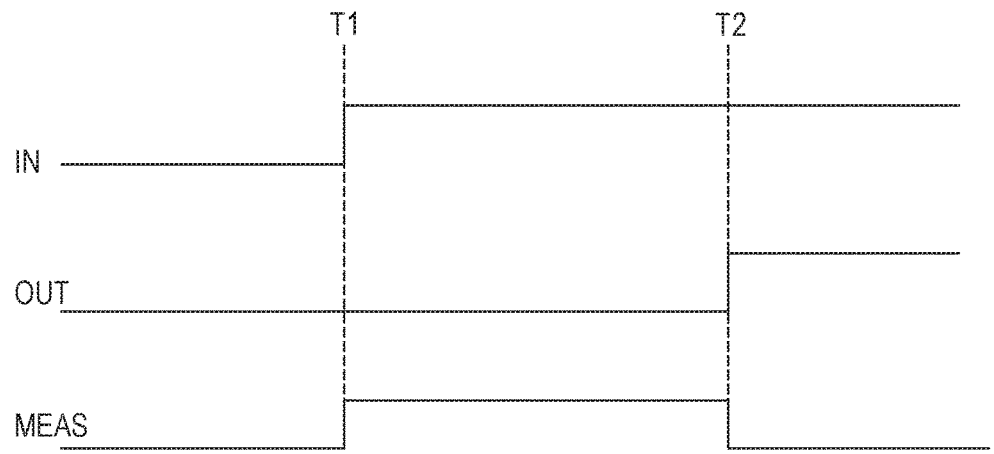
FIG. 6 is a timing diagram of various signals during operation of a signal line measurement circuit according to an embodiment of the invention.

FIG. 6 illustrates a timing diagram of various signals during operation of a signal line measurement circuit according to an embodiment of the invention. For example, with reference to the signal line measurement circuit 300 of FIG. 3, an input signal IN is provided to the signal line model 310 and the measurement circuit 320. At time T1, the IN signal transitions from a low logic level to a high logic level. The IN signal is provided to a model signal line of the signal line model 310 and propagated through the model signal line to provide an output signal OUT. The OUT signal is provided to the measurement circuit 320. Following time T1 at time T2, the OUT signal transitions from a low logic level to a high logic level responsive to the transition of the IN signal at time T1. The time between times T2 and T1 represents a propagation delay of the model signal line. Measurement information MEAS provided by the measurement circuit 320 transitions from a low logic level to a high logic level responsive to the transition of the IN signal at time T1, and further transitions from the high logic level to the low logic level responsive to the transition of the OUT signal at time T2. The resulting MEAS information includes a pulse having a pulse width that is representative of the propagation delay of the model signal line. A signal provided to a signal line being modeled by the model signal line may be based on the MEAS information provided, as previously discussed. For example, a signal may be based in some embodiments on the pulse width of the MEAS information. A characteristic of the signal may be based at least in part on and/or adjusted based at least in part on the MEAS information, such as, a voltage level of the signal, a pulse duration, as well as other characteristics, may be based at least in part on the MEAS information.

Figure 7:
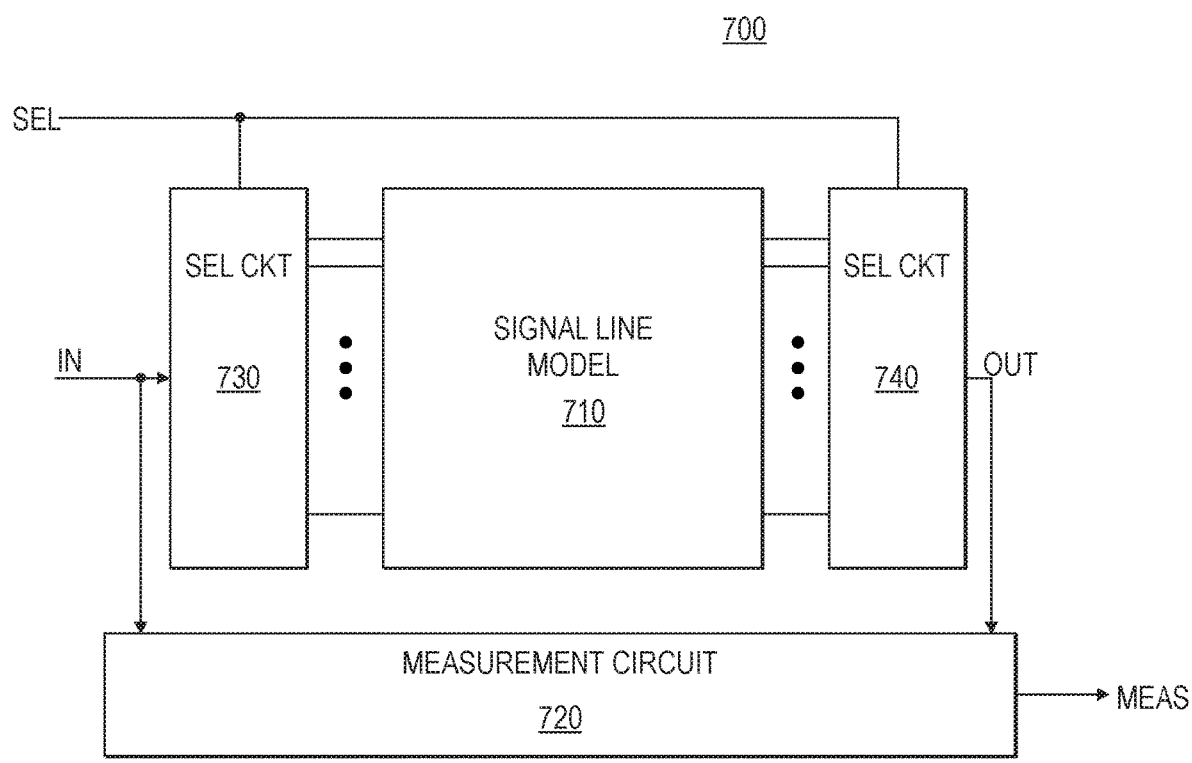
FIG. 7 is a block diagram of a signal line model measurement circuit according to an embodiment of the invention.

FIG. 7 illustrates a signal line model measurement circuit 700 according to an embodiment of the invention. The signal line model measurement circuit 700 includes a signal line model 710 and a measurement circuit 720. The signal line model 710 may include model signal lines (not shown in FIG. 7) that may be configured to model electrical characteristics of a signal line or signal lines. The signal line or lines being modeled may be included in another circuit of an apparatus also including the signal line model measurement circuit 700, for example, a signal line included in a memory array of a memory. Although similar to the signal line model measurement circuit 300 of FIG. 3, the signal line model measurement circuit 700 includes selection circuits 730 and 740 coupled to the signal line model 710. The selection circuits 730 and 740 are configured to selectively couple a model signal line of the signal line model 710 to receive an input signal IN and provide an output signal OUT based on a selection signal SEL. The selection circuits 730 and 740 may be multiplexers in some embodiments. Other circuits may be used to implement the selection circuits 730 and 740 as well.

As previously discussed, the OUT signal may have a delay relative to the IN signal that represents a propagation delay of the model signal line. The measurement circuit 720 may be configured to measure an electrical characteristic of the model signal lines of the signal line model 710. For example, in some embodiments of the invention, the measurement circuit 720 is configured to measure a propagation delay of a model signal line. Based on the measurement, the measurement circuit 720 provides a measurement information MEAS that represents the measurement of the measured electrical characteristic.

In some embodiments, the SEL signal may be based at least in part on a memory address. As a result, which of the model signal lines coupled to receive the IN signal and provide the OUT signal may be related to the memory address. For example, a model signal line of the signal line model 710 may be coupled by the selection circuits 730 and 740 to be measured when a signal line being modeled (e.g., associated with the memory address) is to be used during a memory access operation to memory associated with the memory address. As previously discussed, signal lines such as word lines of a 3D NAND memory array may have different electrical characteristics. Selecting a model signal line for measurement by a memory address may allow for a voltage provided to the signal line being modeled to be based on the measured electrical characteristic.

With reference to FIG. 7, in operation, an input signal IN is provided to the selection circuit 730, which provides the IN signal to a model signal line selected based on the SEL signal. The selection circuit 740 also couples the selected model signal line to provide the OUT signal based on the SEL signal. An example of an IN signal is a signal that includes a signal transition from one logic level to the other logic level (e.g., from a low logic level to a high logic level). The resulting OUT signal for this example is the IN signal after propagating through the model signal line. The measurement circuit 720 receives both the IN signal and OUT signal to measure the electrical characteristic of the model signal line, for example, in some embodiments, a propagation delay of the model signal line. Based on the measurement, the measurement circuit 720 provides MEAS information that represents the measurement of the measured electrical characteristic. In an embodiment that measures the propagation delay of the model signal line, the MEAS information may include a pulse having a pulse width that represents a propagation delay of the model signal line. The MEAS information by the measurement circuit 720 may be used to set, for example, operational conditions for operations involving the signal line that was modeled by the model signal line measured by the measurement circuit 720. In some embodiments, a characteristic of a signal provided to a signal line modeled by the model signal line may be based at least in part on and/or adjusted based at least in part on the MEAS information. Examples of characteristics of the signal include a voltage level of the signal, a pulse duration, as well as other characteristics.

Figure 8:
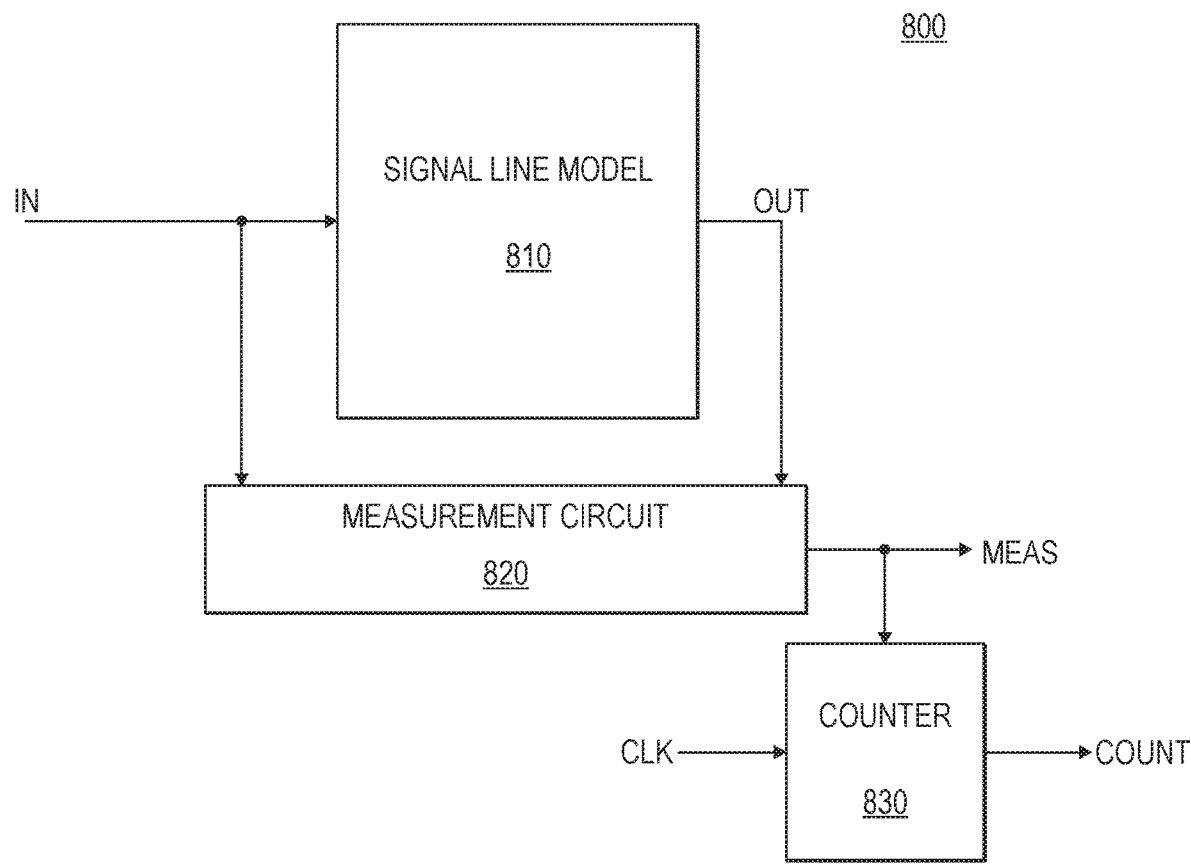
FIG. 8 is a block diagram of a signal line model measurement circuit according to an embodiment of the invention.

FIG. 8 illustrates a signal line model measurement circuit 800 according to an embodiment of the invention. The signal line model measurement circuit 800 includes a signal line model 810 and a measurement circuit 820. The signal line model 810 may include model signal lines (not shown in FIG. 8) that may be configured to model electrical characteristics of a signal line or signal lines. The signal line or lines being modeled may be included in another circuit in an apparatus also including the signal line model measurement circuit 800, for example, a signal line included in a memory array of a memory. The measurement circuit 820 may be configured to measure an electrical characteristic of the model signal lines of the signal line model 810 and provide measurement information MEAS. For example, in some embodiments of the invention, the measurement circuit 820 is configured to measure a propagation delay of a model signal line. In an embodiment that measures the propagation delay of the model signal line, the MEAS information may include a pulse having a pulse width that represents a propagation delay of the model signal line. Based on the measurement, the measurement circuit 820 provides the MEAS information that represents the measurement of the measured electrical characteristic. Although similar to the signal line measurement circuit 300 of FIG. 3, the signal line model measurement circuit 800 is coupled to provide a counter 830 the MEAS information. The counter 830 is configured to count a number of clock cycles of a clock signal CLK with regards to the MEAS information and provide a count signal COUNT representing the number of clock cycles. For example, in an embodiment where the MEAS information includes a pulse, the counter 830 may count the number of clock cycles within the pulse (e.g., between a rising edge and falling edge of a positive pulse of the MEAS information).

With reference to FIG. 8, in operation, an input signal IN is provided to a model signal line of the signal line model 810. The IN signal propagates through the model signal line and provides an output signal OUT. The measurement circuit 820 receives both the IN signal and OUT signal to measure the electrical characteristic of the model signal line, for example, in some embodiments, a propagation delay of the model signal line. Based on the measurement, the measurement circuit 820 provides MEAS information that represents the measurement of the measured electrical characteristic. The counter 830 counts the number of clock cycles of the CLK signal, for example, between a first transition of the MEAS information and a second transition of the MEAS information, and provides the COUNT signal representing the counted number. The MEAS information and the COUNT signal provided by the measurement circuit 820 and the counter 830 may be used to set, for example, operational conditions for operations involving the signal line that was modeled by the model signal line measured by the measurement circuit 820. In some embodiments, a characteristic of the signal may be based at least in part on and/or adjusted based at least in part on the MEAS information and/or the COUNT signal. Examples of characteristics of the signal include a voltage level of the signal, a pulse duration, as well as other characteristics.

Figure 9:
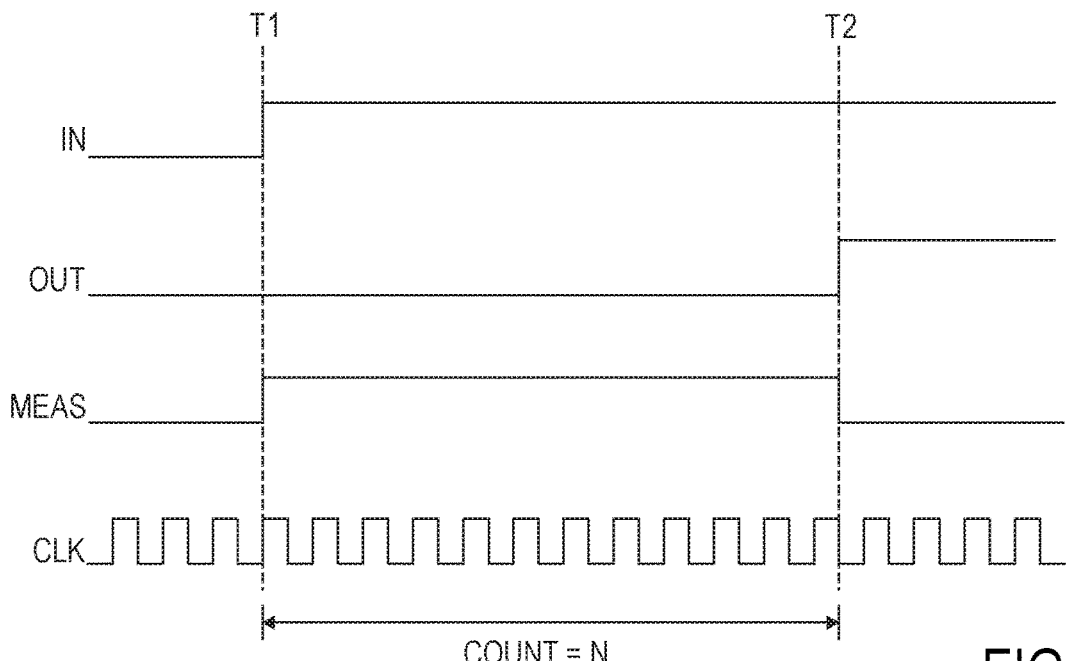
FIG. 9 is a timing diagram of various signals during operation of a signal line measurement circuit according to an embodiment of the invention.

FIG. 9 illustrates a timing diagram of various signals during operation of a signal line measurement circuit according to an embodiment of the invention. For example, with reference to the signal line model measurement circuit 800 of FIG. 8, an input signal IN is provided to the signal line model 810 and the measurement circuit 820. At time T1, the IN signal transitions from a low logic level to a high logic level. The IN signal is provided to a model signal line of the signal line model 810 and propagated through the model signal line to provide an output signal OUT. The OUT signal is provided to the measurement circuit 820. Following time T1 at time T2, the OUT signal transitions from a low logic level to a high logic level responsive to the transition of the IN signal at time T1. The time between times T2 and T1 represents a propagation delay of the model signal line. Measurement information MEAS provided by the measurement circuit 820 transitions from a low logic level to a high logic level responsive to the transition of the IN signal at time T1, and further transitions from the high logic level to the low logic level responsive to the transition of the OUT signal at time T2. The resulting MEAS information includes a pulse having a pulse width that is representative of the propagation delay of the model signal line. The counter 830 counts a number of clock cycles of the CLK signal during the pulse of the MEAS information, that is, the number of clock cycles between times T1 and T2, and provides the COUNT signal representing the count number (e.g., N clock cycles).

Figure 10A:
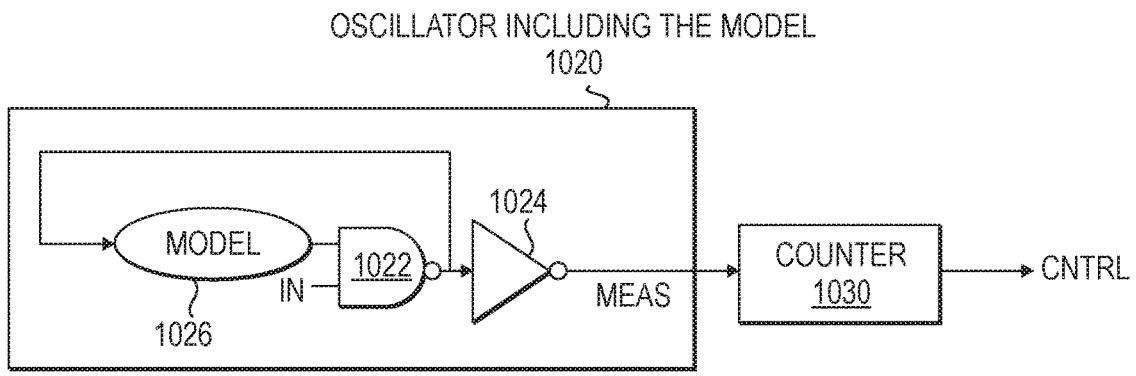
FIG. 10A is a block diagram of a measurement circuit according to an embodiment of the invention for measuring an electrical characteristic of a model signal line.

FIG. 10A illustrates a measurement circuit 1020 according to an embodiment of the invention. The measurement circuit 1020 may be configured to measure an electrical characteristic of a model signal line (e.g., of a signal line model) and provide measurement information MEAS based on the measurement of the electrical characteristic. The measurement circuit 1020 may be a oscillator that utilizes a model signal line to set a cycle time of the MEAS information. In the embodiment illustrated in FIG. 10A, the measurement circuit 1020 includes a NAND logic gate 1022 and an inverter 1024. A model signal line is represented by model signal line 1026, which may represent any model signal line, for example, of a signal line model. The model signal line 1026 is coupled to between an output and an input of the NAND logic gate 1022. In some embodiments, the model signal line 1026 may be coupled to the measurement circuit 1020 using a selection circuit (not shown in FIG. 10A).

As previously discussed, a model signal line may have a propagation delay. The propagation delay of the model signal line 1026 may set a pulse length of an oscillating signal provided as the MEAS information. The oscillating signal is provided by the inverter 1024 to a counter 1030. The counter 1030 is configured to provide a control signal CNTRL based on a count of the oscillating signal. For example, the counter 1030 may be configured to provide a CNTRL signal having an active (e.g., high logic level) width based on a count of falling edges of the MEAS information.

Figure 10B:
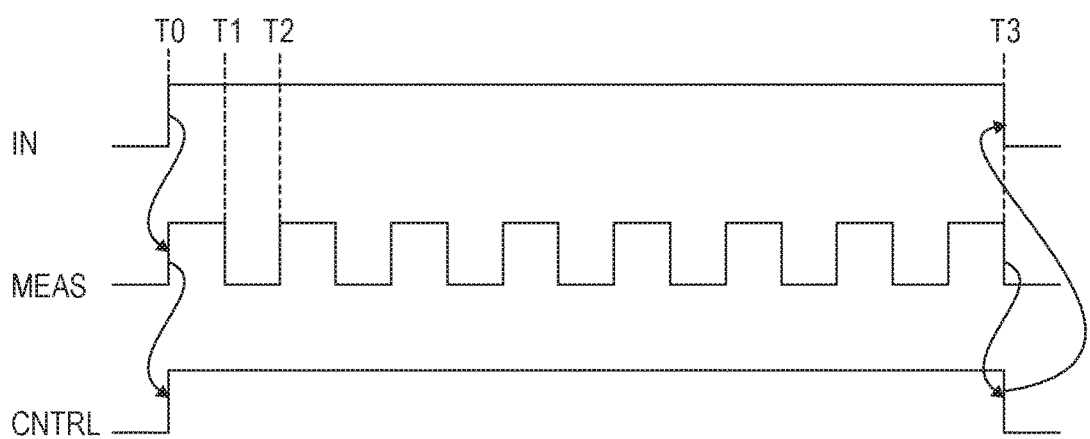
FIG. 10B is a timing diagram of various signals during operation of the measurement circuit according to an embodiment of the invention.

FIG. 10B illustrates various signals during operation of the measurement circuit 1020. At time T0, an input signal IN transitions from a low logic level to a high logic level. Responsive to the transition of the IN signal, the MEAS information also transitions from a low logic level to a high logic level, which causes the counter 1030 to provide a rising edge on the CNTRL signal. Due to the propagation delay of the model signal line 1026, at time T1 the MEAS signal transitions from the high logic level to the low logic level, and then at time T2 the MEAS signal transitions from the low logic level to the high logic level again. The propagation delay of the model signal line 1026 is represented by the pulse widths of the positive (between the first rising edge of the MEAS information to time T1) and negative (between times T1 and T2) pulses. As the MEAS information continues to oscillate between the high and low logic levels, the counter 1030 counts, for example, falling edges of the MEAS information. In the embodiment illustrated by the timing diagram of FIG. 10B, the counter 1030 counts eight falling edges before providing a falling edge for the CNTRL signal at time T3. Responsive to the falling edge of the CNTRL signal, the IN signal transitions to a low logic level. The CNTRL signal provided by the counter 1030 may be used to set a pulse width of a signal applied to a signal line that is modeled by the model signal line 1026. The counter 1030 may be configured to count different events of the MEAS information, and/or count a different number of events. The number of events counted by the counter 1030 set the active width of the CNTRL signal, for example, a greater count will result in a CNTRL signal having a wider active width than a lower count.

As previously discussed, measurement information MEAS provided by a signal line model measurement circuit may be used to set operational conditions for operations involving a signal line that was modeled by a model signal line measured by a measurement circuit. In some embodiments, additional information, such as a COUNT signal and/or a CNTRL signal may be provided and used as well. For example, where a word line of a memory array is being modeled by a model signal line that is measured, the MEAS information, COUNT signal, and/or CNTRL signal may be used to provide a program pulse based on the information. In some embodiments, a voltage level of the program pulse, a pulse duration, and/or other characteristics of the program pulse may be adjusted based on the information. In some embodiments, a parameter (e.g., parameter "A") may be used with the MEAS information to provide a program pulse having a pulse width to sufficiently program memory associated with a word line. The parameter may be predetermined so that a resulting program pulse width may be determined based on the MEAS information. The parameter may be based on various factors, including physical dimensions of the model signal lines, structure and configuration of the model signal line, physical dimensions of the signal lines being modeled (e.g., relative to the model signal lines), experimental and test results, simulation information, anticipated operating conditions as well as other factors not expressly listed. In some embodiments, the COUNT signal, which may represent a number of clock cycles during a pulse width of MEAS information, maybe used by multiplying the clock cycle time by the number of clock cycles, and further multiplied by a parameter. The parameter may be based on various factors, including the ones previously described, and may be the same or different than the parameter used with the MEAS information.

Figure 11:
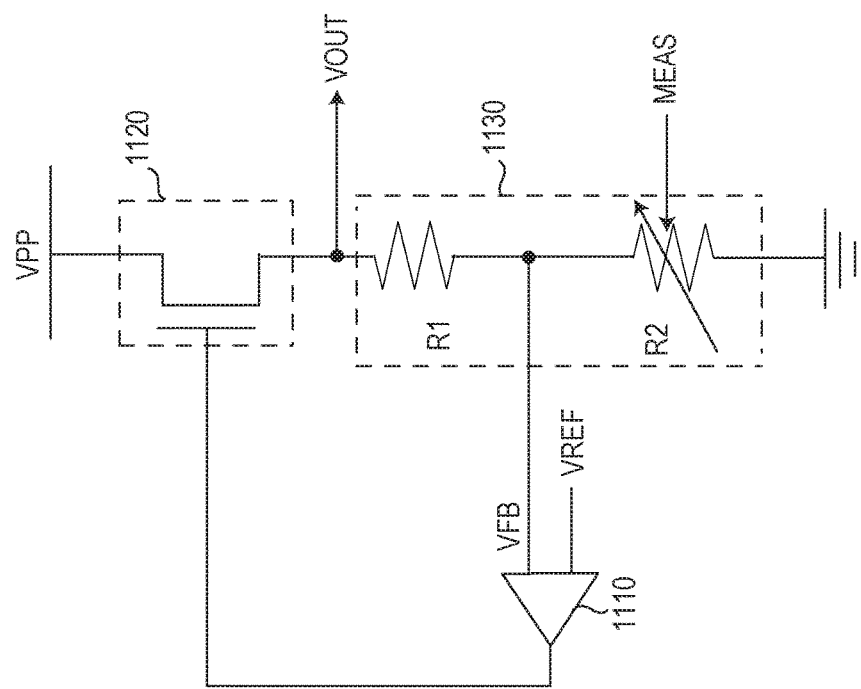
FIG. 11 is a schematic diagram of a signal line driver according to an embodiment of the invention.

FIG. 11 illustrates a signal line driver 1100 according to an embodiment of the invention. The signal line driver 1100 may be configured to provide a signal to a signal line based at least in part on measurement information MEAS resulting from measuring an electrical characteristic of a model signal line. The signal line driver 1100 may be included in the signal line driver 150.

The signal line driver 1100 includes a comparator circuit 1110 configured to compare a reference voltage VREF and a feedback voltage VFB to provide a control voltage VCTRL to a load circuit 1120. The VREF voltage may be provided by a reference voltage source (not shown). The load circuit 1120 is configured to receive a source voltage (e.g., a pumped voltage VPP) and provide an output signal VOUT having a magnitude based on the VCTRL voltage. By comparing the VREF and VFB voltages, the magnitude of the VOUT signal may be regulated relative to the VREF voltage. In some embodiments, the load circuit 1120 may be replaced with a charge pump that is controlled by the VCTRL voltage provided by the comparator circuit 1110.

A voltage divider circuit 1130 is coupled to the load circuit 1120 and configured adjust a resistance based on the MEAS information to change the magnitude of the VOUT signal. The voltage divider circuit 1130 may also be configured to provide the VFB voltage to the comparator circuit 1110, the VFB voltage may also be based at least in part on MEAS information. The voltage divider circuit 1130 is shown in the embodiment of FIG. 11 as including a resistance R1 and an adjustable resistance R2, with the VFB voltage provided from the node to which the resistances R1 and R2 are coupled.

The resistance of the adjustable resistance R2 may be adjusted based on the MEAS information. As a result, the magnitude of the VFB voltage may be based at least in part on the MEAS information. Additionally, the magnitude of the VOUT signal may also be based at least in part on the MEAS information. For example, MEAS information indicating a higher impedance model signal line may cause the adjustable resistance R2 to be reduced, which in turn causes the signal line driver 1100 to provide a VOUT signal having a higher voltage relative to MEAS information indicating a lower impedance model signal line. Thus, a higher impedance model signal line will result in the signal line driver 1100 providing a relatively higher voltage VOUT signal in comparison to a lower impedance model signal line. The MEAS information for a lower impedance model signal line may cause the adjustable resistance R2 to increase, which in turn causes the signal line driver 1100 to provide a VOUT signal having a lower voltage.

The signal line driver 1100 is an example of using the MEAS information to adjust a voltage level of the signal, rather than, for example, the pulse width of a signal. By adjusting the voltage level of the signal, the pulse width of the signal may remain generally the same for different signal lines. As previously discussed, the MEAS information may be based at least in part on a measured electrical characteristic of a signal line. In some embodiments, the MEAS information is provided by a signal line model measurement circuit, for example, the signal line model measurement circuit 120. The VOUT signal may be provided to a signal line that is modeled by a model signal line that is measured in providing the MEAS information. For example, in some embodiments, the VOUT signal is provided to word lines of a memory array for accessing the memory cells, such as a program pulse for storing (e.g., programming) information in the memory cells.

Figure 12:
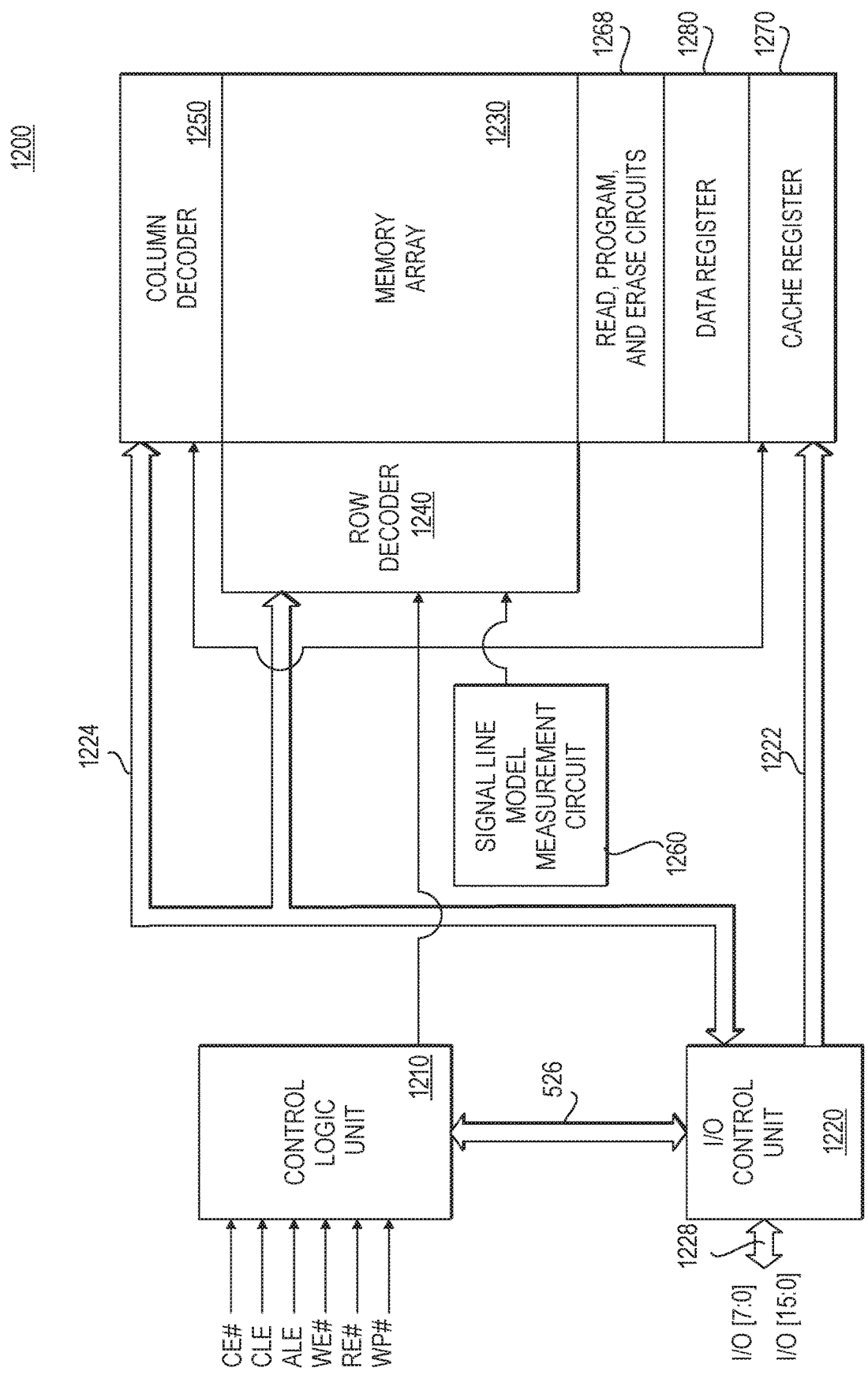
FIG. 12 is a block diagram of a memory according to an embodiment of the invention.

FIG. 12 illustrates a memory 1200 according to an embodiment of the present invention. The memory 1200 includes a memory array 1230 with a plurality of memory cells. The memory cells may be non-volatile memory cells, such as NAND flash cells, phase change memory cells, or may generally be any type of memory cells. In some embodiments, the memory array 1230 is a three-dimensional NAND memory array. Command signals, address signals and data signals may be provided to the memory 1200 as sets of sequential input/output ("I/O") signals transmitted through an I/O bus 1228. Similarly, data signals may be provided from the memory 1200 through the I/O bus 1228. The I/O bus 1228 is connected to an I/O control unit 1220 that routes the signals between the I/O bus 1228 and an internal data bus 1222, an internal address bus 1224, and an internal command bus 1226. The memory 1200 also includes a control logic unit 1210 that receives a number of control signals either externally or through the command bus 1226 to control the operation of the memory 1200.

The address bus 1224 applies block-row address signals to a row decoder 1240 and column address signals to a column decoder 1250. The row decoder 1240 and column decoder 1250 may be used to select blocks of memory or memory cells for memory operations, for example, read, program, and erase operations. The column decoder 1250 may enable data signals to be applied to columns of memory corresponding to the column address signals and allow data signals to be coupled from columns corresponding to the column address signals. The memory 1200 includes a signal line model measurement circuit 1260 according to an embodiment of the invention. The signal line model measurement circuit may be configured to measure an electrical characteristic of model signal lines, and provide measurement information, for example, to the row decoder 1240 for use when providing a voltage to signal lines of the memory array 1230.

In response to the memory commands decoded by the control logic unit 1210, the memory cells in the array 1230 are read, programmed, or erased. Read, program, and erase circuits 1268 coupled to the memory array 1230 receive control signals from the control logic unit 1210 and include current generators for generating various reference currents for read, program and erase operations. In addition to the signal line drivers in the row decoder 1240 and/or column decoder 1250, one or more of the voltage generators or other read, program, and erase circuits 1268 may also include signal line drivers.

After the row address signals have been applied to the address bus 1224, the I/O control unit 1220 routes data signals to a cache register 1270. The data signals are stored in the cache register 1270 in successive sets each having a size corresponding to the width of the I/O bus 1228. The cache register 1270 sequentially stores the sets of data signals for an entire row or page of memory cells in the array 1230. All of the stored data signals are then used to program a row or page of memory cells in the array 1230 selected by the block-row address coupled through the address bus 1224. In a similar manner, during a read operation, data signals from a row or block of memory cells selected by the block-row address coupled through the address bus 1224 are stored in a data register 1280. Sets of data signals corresponding in size to the width of the I/O bus 1228 are then sequentially transferred through the I/O control unit 1220 from the data register 1280 to the I/O bus 1228.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a memory array;
   a plurality of signal lines included in the memory array;
   a signal line driver coupled to a signal line of the plurality of signal lines and configured to provide a voltage to the signal line of the plurality of signal lines; and
   a signal line model measurement circuit coupled to the signal line driver, the signal line model measurement circuit configured to measure an electrical characteristic of a model signal line and provide measurement information of the electrical characteristic to the signal line driver, the signal line driver configured to provide the voltage to the signal line of the plurality of signal lines based at least in part on the measurement information.

2. The apparatus of claim 1, wherein the memory array includes a three-dimensional NAND memory array.

3. The apparatus of claim 1, wherein the plurality of signal lines of the memory array include a plurality of word lines.

4. The apparatus of claim 1, wherein the signal line model measurement circuit includes a signal line model including a plurality of model signal lines.

5. The apparatus of claim 4, wherein the memory array includes a memory structure and the signal line model is configured similarly to the memory structure of the memory array.

6. The apparatus of claim 4, wherein the memory array includes a memory structure and the signal line model is configured differently than the memory structure of the memory array.

7. The apparatus of claim 4, wherein the signal line model measurement circuit includes a selection circuit configured to select one of the plurality of model signal lines for measurement.

8. The apparatus of claim 7, wherein the selection circuit is configured to select one of the plurality of mode signal lines for measurement based at least in part on a memory address of the memory array.

9. The apparatus of claim 1, wherein the signal line model measurement circuit includes a driver having an output impedance similar to the signal line driver.

10. The apparatus of claim 1, wherein the signal line driver is configured to provide a program pulse to the signal line of the plurality of signal lines having a pulse width based at least in part on the measurement information.

11. The apparatus of claim 1, wherein the signal line driver is configured to provide a program pulse to the signal line of the plurality of signal lines having voltage level based at least in part on the measurement information.

12. The apparatus of claim 1, wherein the signal line driver includes:
    a comparator circuit configured to provide a control voltage based at least in part on a reference voltage and a feedback voltage; and
    a load circuit configured to receive the control voltage, and provide, based at least in part on the control voltage, an output signal.

13. An apparatus, comprising:
    a memory array including a plurality of word lines;
    a signal line driver coupled to a word line of the plurality of word lines and configured to provide a voltage to the word line of the plurality of word lines;
    a signal line model measurement circuit coupled to the signal line driver, the signal line model measurement circuit including a model signal line configured to model electrical characteristics of the word line, the signal line model measurement circuit configured to provide measurement information of the electrical characteristics to the signal line driver, the signal line driver configured to provide the voltage to the word line of the plurality of word lines based at least in part on the measurement information.

14. The apparatus of claim 13, further comprising:
    a coupling circuit including a first transistor coupled between the model signal line and an input node of a signal line model, the coupling circuit further including a second transistor coupled between the model signal line and an output node of the signal line model.

15. The apparatus of claim 13, further comprising:
    a coupling circuit coupled to the model signal line and further coupled to an input and output of the signal line model, the coupling circuit configured to couple the model signal line to the input and output.

16. The apparatus of claim 13, further comprising:
a coupling circuit configured to couple the model signal line to ground when the model signal line is not coupled to an input and output.

* * * * *